US005445921A

United States Patent [19]

Palmer

[11] Patent Number: 5,445,921

[45] Date of Patent: Aug. 29, 1995

[54] METHOD OF CONSTRUCTING LOW CROSSTALK FACEPLATES

[75] Inventor: Donald P. Palmer, Ronks, Pa.

[73] Assignee: Burle Technoligies, Inc., Wilmington, Del.

[21] Appl. No.: 225,336

[22] Filed: Apr. 8, 1994

[51] Int. Cl.⁶ .................... G03F 7/00

[52] U.S. Cl. .................... 430/311; 430/319; 430/320; 430/330; 430/396

[58] Field of Search .................... 430/311, 319, 320, 330, 430/396

[56] References Cited

U.S. PATENT DOCUMENTS

| | | | |
|---|---|---|---|
| 4,406,973 | 9/1983 | Stowe | 313/541 |
| 4,567,122 | 1/1986 | Baldry et al. | 430/4 |
| 4,661,079 | 4/1987 | Harris et al. | 313/541 |
| 4,892,388 | 1/1990 | Taylor | 359/240 |
| 5,077,504 | 12/1991 | Hewy | 313/103 R |
| 5,083,017 | 1/1992 | Anno et al. | 313/541 |
| 5,303,282 | 4/1994 | Kwasnick | 378/147 |

*Primary Examiner*—Kathleen Duda
*Attorney, Agent, or Firm*—Martin Fruitman

[57] ABSTRACT

A method of constructing a low crosstalk faceplate for a multiple section photomultiplier tube is disclosed. To prevent scatter of incident radiation into adjacent sections, a glass barrier which absorbs the incident radiation is formed within the faceplate around each clear glass section and across the entire thickness of the faceplate. The construction method involves the use of a glass whose transmission characteristic can be varied by exposure to ultraviolet radiation. Thus, the faceplate is constructed of the U.V. sensitive glass, specific areas are masked, and then the glass is exposed to the required radiation and a following heat treatment. The boundary regions around each photocathode are thereby converted to opaque glass.

1 Claim, 1 Drawing Sheet

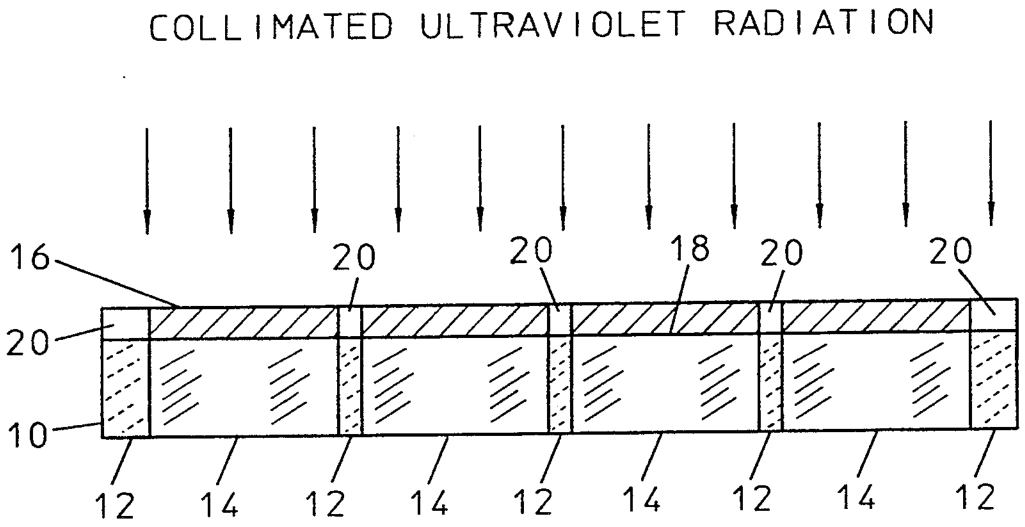
COLLIMATED ULTRAVIOLET RADIATION
16
20
20
18
20
20
20
10
12
14
12
14
12
14
12
14
12

METHOD OF CONSTRUCTING LOW CROSSTALK FACEPLATES

BACKGROUND OF THE INVENTION

This invention deals generally with electric lamp and discharge devices, and more specifically with the structure of a faceplate upon which is constructed the photocathode of a multiple anode photomultiplier tube.

Photomultiplier tubes have become commonly used instruments for detecting low radiation levels. Typically, they consist of a glass envelope with an electron emitting photocathode located on the inside surface of a faceplate of the envelope. When light or other radiation strikes the faceplate, it is transmitted through the faceplate to the photocathode. Electrons emitted from photocathode are then directed toward and collected by an electron multiplier. The electron multiplier consists of several secondary electron emitting dynodes, the first of which receives the electrons from the photocathode. The several dynodes are usually located in a single grouping, frequently referred to as a dynode cage. The electron multiplier delivers its electrons to an anode which has an electrical output which is directly related to the quantity of electrons collected by the first dynode. Multiple section photomultiplier tubes are not all that uncommon. They are particularly useful in radiation studies, including the study of light sources, in which the radiation falls on a large area, with different intensities, time sequences, or patterns impinging upon various portions of the area irradiated. While such fields can be studied by arrays of individual photomultiplier tubes when the radiation field is large enough, for small fields it is extremely difficult to construct tubes small enough and to pack individual tubes close enough to attain good definition and to avoid blocking out significant regions with the external envelopes of the adjacent tubes.

Multiple section photomultiplier tubes alleviate this problem by furnishing the effect of several tubes in one envelope. This permits closer packing of the active elements because the adjacent sections are not separated by portions of two envelopes. Several multiple section photomultiplier tubes are now available and are covered in the prior art, but they have problems which are not associated with the use of multiple independent tubes.

One problem is the need toconstruct and physically locate the multiple sections within a small envelope. One solution to this problem has been to construct similar electron multiplier dynode cages for each of the several sections, to locate them in close proximity to each other and then to attempt to isolate them in terms of the electron optics of the tube sections, so that the sections will operate independently. This has not always been successful.

"Crosstalk", that is, the interchange of signals between tube sections, is a continuing source of problems in such tubes, and many designs have been proposed to counteract such crosstalk. Crosstalk can occur not only between the electrons generated by the several dynodes, when the electrons move between electron multiplier sections, but also in the faceplate of the tube between the outside glass surface and the photocathode. In this situation, light falling on one section of the faceplate is transmitted across the fafaceplate thickness at some angle so that it actually affects a photocathode associated with a different section of the tube, thus yielding false information about the location of light falling on the faceplate.

One solution to this optical crosstalk in the region of the faceplate between the outside of the tube and the photocathode has been to place light shields within the faceplate to isolate the light falling on each section of the faceplate from the other sections.

Such optical isolation has until now been accomplished in some photomultiplier by inserting metal shields into grooves in the outside surface of the faceplate, but this structure has not fully isolated faceplate sections because such slots must not, of course, penetrate the entire thickness of the faceplate, or they would compromise the vacuum within the tube. When such metal strips penetrate the entire thickness of the faceplate and are fully integrated into the faceplate, it requires a complex grid structure of individual small glass faceplates with multiple glass to metal seals to the isolating metal grid. Such structures are very costly to construct and yield poor reliability due to the many possibilities of vacuum leaks.

Another structure which has been used for optical isolation, but only in single section image intensifier tubes, has been opaque glass fused around the one clear glass section of the faceplate. While such structures are reasonable for single section faceplates, they would be extremely complex and quite difficult to construct in a multiple section faceplate. In effect, each section of the faceplate would have to be individually constructed and then the several sections would have to be joined. Such a structure would likely be even more difficult to construct and less reliable than the multiple section faceplate built from a metal grid isolating structure sealed to individual clear glass faceplates.

SUMMARY OF THE INVENTION

The present invention describes another method of building multiple section photomultiplier faceplates in which each faceplate section is optically isolated from all the others so that the faceplate provides very low optical crosstalk. The invention is a method of forming within the faceplate an integral opaque glass barrier which absorbs the incident radiation within the faceplate around each clear glass section and across the entire thickness of the faceplate to prevent light scatter into adjacent faceplate sections.

The construction method involves the use of a glass whose transmission characteristic can be varied by exposure to ultraviolet radiation. Thus, the faceplate is first constructed from a single piece of the U.V. sensitive glass, specific areas are masked, and then the glass is exposed to the required radiation so that the unmasked boundary regions around each individual photocathode region are exposed to the U.V. radiation. Subsequent heat treatment then causes the exposed areas to be converted to opaque glass. This conversion to opaque glass is accomplished with no need for any additional structure within the faceplate, and with no risk to the vacuum integrity of the faceplate. Such a process furnishes a unitized faceplate with no special problems in vacuum integrity, because no additional vacuum seals are required other than the normal seals around the periphery of the faceplate.

Another very important advantage of the process is that the cost and time involved in the forming of the light barriers within the faceplate are relatively low and are virtually independent of the number of photocathode sections within the faceplate. Once the radiation shielding mask is constructed, and such masks can easily be made so that they are reusable, the time of exposure of the faceplate to the radiation which modifies the light transmission characteristics of the glass is absolutely independent of the number of sections within the tube. Thus, it takes no more time and labor to construct a sixteen section faceplate than to construct a three section faceplate.

The present invention therefore furnishes a method of constructing faceplates for multiple section photomultiplier tubes which yields lower costs, more reliable vacuum integrity, and lower optical crosstalk than has previously been available for such faceplates.

BRIEF DESCRIPTION OF THE DRAWING

The FIGURE is a cross section view of the arrangement for using the preferred method of constructing a low crosstalk faceplate.

DETAILED DESCRIPTION OF THE. INVENTION

The FIGURE is a cross section view of the arrangement by which the invention is practiced to construct a low crosstalk faceplate for a multiple section photomultiplier tube.

Faceplate 10 for a photomultiplier tube is first constructed of a transparent ultraviolet sensitive glass such as is produced by Corning Incorporated under the registered trademark FOTOFORM, by Schott Glasswerke under the trademark FOTURAN, or Hoya Corporation designated as Photosensitive Glass PEG 3. The faceplate is constructed in a conventional manner as is well established in the tube construction art. The only difference between the originally formed faceplate of the invention and those previously made is the material from which the faceplate of the present invention is made.

However, after faceplate 10 is originally formed, it is subjected to further processing, as described in relation to the FIGURE, quite different from the treatment of prior art faceplates.

To produce light absorbing opaque boundaries 12 around each transparent section 14 of faceplate 10, mask 16 is formed and placed adjacent to surface 18 of faceplate 10. Mask 16 must be opaque to ultraviolet radiation, and it includes openings 20 aligned with the locations of boundaries 12, which are eventually required to be made opaque. The opaque sections of mask 16 are aligned to cover transparent sections 14 of faceplate 10.

With mask 16 in place on faceplate 10, both mask 16 and faceplate 10 are exposed to collimated ultraviolet radiation from the side of mask 16 opposite from the side in contact with faceplate 10. Typical intensities of ultraviolet exposure at 312 nanometers wavelength are 3000 watts for a typical time of exposure of 7–8 minutes or 1000 watts for 11–12 minutes, although the exact values will vary with the particular structure of the faceplate. Collimated radiation is used so that the edges of mask openings 20 illuminate volumes through the entire thickness of faceplate 10, with the boundaries of the illuminated volumes being sharply defined and exactly perpendicular to surface 18 of faceplate 10. This precise illumination eventually produces solid opaque boundaries 12 through the entire thickness of faceplate 10 with the edges of boundaries 12 also perpendicular to surface 18.

After faceplate 10 has been exposed to the ultraviolet radiation, another step is still necessary to develop the image and to actually convert boundaries 12 to their final opaque form. Faceplate 10 is therefore heat treated. The typical temperature of such heat treatment is 600 degrees Centigrade, and length of time of such treatment varies with the configuration and volume of the faceplate so that some experimentation is required in most applications. However, for a faceplate of 3.0 square inches area which is 0.060 inches thick, the typical time at 600 degrees centigrade is 1 hour.

The multiple section, low crosstalk faceplate can therefore be produced in a simple two step process, and the process is independent of the number of transparent sections within the faceplate. Furthermore, the coefficient of thermal expansion of the opaque portions of the faceplate is modified by the processing, and after processing it is very close to the coefficient of thermal expansion of the photomultiplier tube envelope. Since the peripheral edges of the faceplate are always made to be opaque, the faceplate therefore is easily and reliably sealed to the balance of the tube envelope.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, the same method can be used with curved faceplates or with assembled tubes, and the opaque boundaries could be constructed with edges which are angled to the faceplate surface.

What is claimed as new and for which Letters patent of the United States are desired to be secured is:

1. A method of constructing a multiple section photomultiplier faceplate consisting essentially of:

forming a faceplate of transparent glass which reacts to ultraviolet radiation and subsequent heat treatment by becoming opaque in the locations exposed to ultraviolet radiation;

forming a mask which is opaque to ultraviolet radiation and which includes openings through the mask which correspond to the locations of the faceplate which are desired to be opaque;

positioning the mask adjacent to a surface of the faceplate;

exposing the mask and faceplate to collimated ultraviolet radiation sufficient to activate the reaction of the glass to ultraviolet radiation; and heating the faceplate to a temperature and for a time sufficient to convert the portions of the faceplate exposed to ultraviolet radiation to an opaque material.

* * * * *

UNITED STATES PATENT AND TRADEMARK OFFICE
CERTIFICATE OF CORRECTION

PATENT NO. : 5,445,921

DATED : Aug. 29, 1995

INVENTOR(S) : Donald P. Palmer

It is certified that error appears in the above-identified patent and that said Letters Patent is hereby corrected as shown below:

On the title page, item [73] Assignee:

change "Technoligies" to --Technologies --

Signed and Sealed this

Twenty-sixth Day of December, 1995

Attest:

BRUCE LEHMAN

*Attesting Officer*

*Commissioner of Patents and Trademarks*